(12) United States Patent
Youn et al.

(10) Patent No.: US 7,696,552 B2
(45) Date of Patent: Apr. 13, 2010

(54) SEMICONDUCTOR DEVICES INCLUDING HIGH-K DIELECTRIC MATERIALS

(75) Inventors: Sun-Pil Youn, Seoul (KR); Chang-Won Lee, Gyeonggi-do (KR); Woong-Hee Sohn, Gyeonggi-do (KR); Gil-Heyun Choi, Gyeonggi-do (KR); Jong-Ryeol Yoo, Gyeonggi-do (KR); Dong-Chan Lim, Seoul (KR); Jae-Hwa Park, Gyeonggi-do (KR); Byung-Hak Lee, Gyeonggi-do (KR); Hee-Sook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 510 days.

(21) Appl. No.: 11/227,541

(22) Filed: Sep. 15, 2005

(65) Prior Publication Data

US 2006/0057794 A1    Mar. 16, 2006

(51) Int. Cl.
*H01L 27/108* (2006.01)
*H01L 29/94* (2006.01)

(52) U.S. Cl. ............... 257/296; 257/306; 257/310; 257/324; 257/E27.081; 257/E29.165; 257/E29.3

(58) Field of Classification Search ........... 257/310, 257/306, 296, 324, E27.081, E29.3
See application file for complete search history.

(56) References Cited

U.S. PATENT DOCUMENTS 5,057,898 A  * 10/1991 Adan et al. ........... 257/369

5,341,014 A  * 8/1994 Fujii et al. ........... 257/377
5,631,186 A  * 5/1997 Park et al. ........... 438/155

(Continued)

FOREIGN PATENT DOCUMENTS

JP          403177065 A  * 8/1991

(Continued)

OTHER PUBLICATIONS

Notice to Submit a Response for Korean Patent Application No. 10-2004-0074074 mailed on Apr. 6, 2006.

(Continued)

*Primary Examiner*—Walter L Lindsay, Jr.
*Assistant Examiner*—Ron Pompey
(74) *Attorney, Agent, or Firm*—Myers Bigel Sibley & Sajovec

(57) ABSTRACT

A semiconductor device includes a first conductive layer on a semiconductor substrate, a dielectric layer including a high-k dielectric material on the first conductive layer, a second conductive layer including polysilicon doped with P-type impurities on the dielectric layer, and a third conductive layer including a metal on the second conductive layer. In some devices, a first gate structure is formed in a main cell region and includes a tunnel oxide layer, a floating gate, a first high-k dielectric layer, and a control gate. The control gate includes a layer of polysilicon doped with P-type impurities and a metal layer. A second gate structure is formed outside the main cell region and includes a tunnel oxide layer, a conductive layer, and a metal layer. A third gate structure is formed in a peripheral cell region and includes a tunnel oxide, a conductive layer, and a high-k dielectric layer having a width narrower than the conductive layer. Method embodiments are also disclosed.

7 Claims, 7 Drawing Sheets

U.S. PATENT DOCUMENTS

| | | | |
|---|---|---|---|
| 5,858,831 A * | 1/1999 | Sung | 438/241 |
| 6,304,484 B1 * | 10/2001 | Shin et al. | 365/185.03 |
| 6,455,373 B1 * | 9/2002 | Pham et al. | 438/257 |
| 6,617,639 B1 | 9/2003 | Wang et al. | 257/324 |
| 6,642,573 B1 | 11/2003 | Halliyal et al. | 257/316 |
| 6,960,796 B2 * | 11/2005 | Rhodes et al. | 257/222 |
| 2003/0151069 A1 | 8/2003 | Sugimae et al. | |

FOREIGN PATENT DOCUMENTS

| | | |
|---|---|---|
| JP | 04-045710 | 3/1992 |
| JP | 05243582 A | 9/1993 |
| JP | 410289957 A * | 10/1998 |
| JP | 2003-318287 | 11/2003 |
| KR | 1998-053432 | 9/1998 |
| KR | 1998-079362 | 11/1998 |

OTHER PUBLICATIONS

First Office Action for Chinese Patent Application No. 200510104111.8 dated May 30, 2008 and an English Language Translation thereof.

* cited by examiner

SEMICONDUCTOR DEVICES INCLUDING HIGH-K DIELECTRIC MATERIALS

CROSS REFERENCE TO RELATED APPLICATION

This application claims priority under 35 USC § 119 to Korean Patent Application No. 10-2004-0074074 filed on Sep. 16, 2004, the disclosure of which is hereby incorporated herein by reference in its entirety.

FIELD OF THE INVENTION

The present invention relates to semiconductor devices and methods of forming semiconductor devices. In particular, the present invention relates to semiconductor devices having dielectric layers, and methods of forming the same.

BACKGROUND

A flash memory device generally includes a cell transistor that has a tunnel oxide layer pattern, a first gate pattern serving as a floating gate, a dielectric layer pattern and a second gate pattern serving as a control gate. When a voltage is applied to the control gate, electrons may be injected into the floating gate to store charge therein, which represents data in the flash memory device. A flash memory device may be improved by reducing the loss of the voltage applied to the floating gate. The loss of the voltage applied to the floating gate may be reduced for example, by improving the capacitive coupling ratio of the device.

As the feature sizes of semiconductor devices continuously decrease, the dielectric layer pattern of a flash memory device may occupy a smaller and smaller area. When the dielectric layer pattern has a small area, the capacitive coupling ratio of the flash memory device may also decrease. Thus, to maintain the capacitive coupling ratio of the flash memory device, it may be desirable to form the dielectric layer pattern with a reduced thickness.

However, as the thickness of the dielectric layer pattern is reduced, leakage current between the floating gate and the control gate may increase, which may reduce the capacitive coupling ratio of the flash memory device. Such leakage current may also impair the electrical characteristics of flash memory devices.

To reduce leakage current and to improve the capacitive coupling ratio, a high-k dielectric material has been employed as the dielectric layer of a flash memory device. Methods of forming a dielectric layer using a high-k dielectric material are disclosed, for example, in U.S. Pat. No. 6,642,573 issued to Halliyal et al., and/or U.S. Pat. No. 6,617,639 issued to Wang et al., the disclosures of which are incorporated herein by reference in their entireties.

When a dielectric layer including a high-k dielectric material is employed together with a control gate of polysilicon doped with N-type impurities, the work function of the control gate may be too low, such that tunneling current between the dielectric layer and the control gate may increase. Hence, a metal having a high work function may be employed for the control gate instead of polysilicon doped with the N-type impurities in order to reduce the tunneling current. However, when the control gate is formed using a metal having a high work function, some problems may result, as described below.

FIG. 1 is a schematic cross-sectional view illustrating conventional methods of forming a semiconductor device. As shown therein, a tunnel oxide layer 12 and a polysilicon layer 14 are sequentially formed on a semiconductor substrate 10 including a cell region 11 and a peripheral circuit region 13. The polysilicon layer 14 is patterned to form a floating gate (not shown).

After a high-k dielectric material layer and a metal layer are successively formed on the polysilicon layer 14, the metal layer and the high-k material layer are patterned to form a preliminary control gate 18 and a dielectric layer pattern 16 on the polysilicon layer 14. Since the dielectric layer 16 is formed in the cell region only, it may be desirable to use a hard mask (not shown) to form the dielectric layer 16. If the hard mask is formed using silicon nitride or silicon oxide, the hard mask may react chemically with the dielectric layer pattern 16, which may impair the electrical characteristics of the dielectric layer pattern 16. Therefore, the hard mask may generally be formed using a metal.

However, a hard mask layer formed of metal may be oxidized during an ashing process used for removing a photoresist pattern (which may be used, for example, as an etching mask for forming the preliminary control gate 18). When the hard mask made of metal is oxidized as described above, the interface resistance between the dielectric layer 16 and the preliminary control gate 18 may increase. In addition, the preliminary control gate 18 and/or the hard mask may be lifted away from the dielectric layer 16. Furthermore, it may be desirable to form an additional metal layer in the peripheral circuit region 13 after forming the dielectric layer 16, because the preliminary control gate 18 may be removed in the peripheral circuit region 13 in an etching process used for forming the dielectric layer 16. Thus, processes for forming the dielectric layer 16 and the preliminary control gate 18 may be complicated, because two metallizations may be required to form a control gate 18 in both the cell region 11 and the peripheral circuit region 13.

SUMMARY OF THE INVENTION

A semiconductor device according to some embodiments of the invention includes a first conductive layer on a semiconductor substrate, a dielectric layer including a high-k dielectric material on the first conductive layer, a second conductive layer including polysilicon doped with P-type impurities on the dielectric layer, and a third conductive layer including a metal on the second conductive layer.

The first conductive layer may include polysilicon doped with N-type impurities.

The high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, MgO, SrO, $B_2O_2$, $SnO_2$, PbO, $PbO_2$, $Pb_3O_4$, $V_2O_3$, $La_2O_3$, $Pr_2O_3$, $Sb_2O_3$, $Sb_2O_5$ and/or CaO.

The dielectric layer may include an ONO structure including at least one silicon oxide film and at least one silicon nitride film, and the third conductive layer may include a metal nitride film and/or a metal film. In particular, the third conductive layer may include a metal nitride film and a metal film, and the metal film may include tungsten, titanium and/or tantalum, and the metal nitride film may include tungsten nitride, titanium nitride, tantalum nitride and/or titanium aluminum nitride.

A semiconductor device according to further embodiments of the invention includes a tunnel oxide layer in a cell area of a semiconductor substrate including at least a main cell region and a peripheral cell region, a floating gate including a first conductive layer on the tunnel oxide layer, a dielectric layer including a high-k material on the floating gate, and a control gate on the dielectric layer. The control gate may include a second conductive layer including polysilicon doped with P-type impurities and a third conductive layer including a metal.

The first conductive layer may include polysilicon doped with N-type impurities, and the high-k material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$.

The dielectric layer may further include an ONO structure including a silicon oxide film and a silicon nitride film.

The third conductive layer may include a metal nitride film and/or a metal film. In particular, the third conductive layer may include a metal nitride film and a metal film. The metal film may include tungsten, titanium and/or tantalum, and the metal nitride film may include tungsten nitride, titanium nitride, tantalum nitride and/or titanium aluminum nitride.

The tunnel oxide layer, the floating gate and the third conductive layer may form a device structure in the peripheral cell region outside the main cell region.

The dielectric layer and the second conductive layer of the device structure may have widths substantially smaller than a width of the floating gate of the device structure.

A semiconductor device according to additional embodiments of the invention includes a semiconductor substrate including a cell area having a main cell region and a peripheral cell region, and a peripheral circuit area outside the cell area. A first gate structure is formed in the main cell region. The first gate structure includes a first tunnel oxide layer, a floating gate including a first conductive layer on the first tunnel oxide layer, a first dielectric layer including a first high-k dielectric material on the floating gate, and a control gate on the first dielectric layer. The control gate includes a second conductive layer including polysilicon doped with P-type impurities and a third conductive layer including metal. A second gate structure is formed outside the main cell region. The second gate structure includes a second tunnel oxide layer, a fourth conductive layer on the second tunnel oxide layer, and a fifth conductive layer including metal on the fourth conductive layer.

The first conductive layer and/or the fourth conductive layer may include polysilicon doped with N-type impurities.

The first high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$.

The first dielectric layer may further include a silicon oxide film and a silicon nitride film.

The third conductive layer and/or the fifth conductive layer may include a metal nitride film and a metal film. In particular, the metal film may include tungsten, titanium and/or tantalum, and the metal nitride film may include tungsten nitride, titanium nitride, tantalum nitride and/or titanium aluminum nitride.

The device may further include a third gate structure including a third tunnel oxide layer formed in the peripheral cell region, a sixth conductive layer on the third tunnel oxide layer, a second dielectric layer on the sixth conductive layer. The second dielectric layer may include a second high-k dielectric material and may have a width narrower than a width of the sixth conductive layer. A seventh conductive layer including polysilicon doped with P-type impurities may be the second dielectric layer, and an eighth conductive layer including a metal may be on the seventh conductive layer.

The second high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$.

The second dielectric layer further may include a silicon oxide film and a silicon nitride film.

Methods of forming semiconductor devices according to embodiments of the invention include forming a first conductive layer on a semiconductor substrate, forming a dielectric layer including a high-k dielectric material on the first conductive layer, forming a second conductive layer including polysilicon doped with P-type impurities on the dielectric layer, and forming a third conductive layer including a metal on the second conductive layer.

The first conductive layer may include polysilicon doped with N-type impurities. The dielectric layer may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$.

Forming the second conductive layer may include forming a polysilicon layer on the dielectric layer and doping the polysilicon layer with P-type impurities.

Forming the dielectric layer may include forming a silicon oxide film on the first conductive layer, forming a silicon nitride film on the silicon oxide film, and forming a high-k dielectric material on the silicon nitride film.

Forming the third conductive layer may include forming a metal nitride film on the second conductive layer, and forming a metal film on the metal nitride film. The metal film may include tungsten, titanium and/or tantalum, and the metal nitride film may include tungsten nitride, titanium nitride, tantalum nitride and/or titanium aluminum nitride.

Method of forming semiconductor devices according to further embodiments of the invention include forming a tunnel oxide layer in a main cell region of a cell area of a semiconductor substrate, forming a floating gate including a first conductive layer on the tunnel oxide layer, forming a dielectric layer including a high-k dielectric material on the floating gate, and forming a control gate on the dielectric layer, the control gate including a second conductive layer including polysilicon doped with P-type impurities and a third conductive layer including a metal.

The floating gate may include polysilicon doped with N-type impurities. The dielectric layer may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$.

Forming the second conductive layer may include forming a polysilicon layer on the dielectric layer and doping the polysilicon layer with P-type impurities.

Forming the dielectric layer may include forming a silicon oxide film on the floating gate, forming a silicon nitride film on the silicon oxide film, and forming a high-k dielectric film on the silicon nitride film.

Forming the third conductive layer may include forming a metal nitride film on the second conductive layer, and forming a metal film on the metal nitride film. The metal film may include tungsten, titanium and/or tantalum, and the metal nitride film may include tungsten nitride, titanium nitride, tantalum nitride and/or titanium aluminum nitride.

Methods according to some embodiments of the invention may further include forming a second tunnel oxide layer in a peripheral cell region of the cell area, forming a fourth conductive layer on the second tunnel oxide layer, forming a second dielectric layer including a high-k dielectric material on the fourth conductive layer, and forming a polysilicon layer on the second dielectric layer The second dielectric layer and the polysilicon layer may have widths substantially smaller than a width of the fourth conductive layer.

In addition, methods according to some embodiments of the invention may further include forming a fifth conductive layer including a metal on the polysilicon layer and on the fourth conductive layer. The polysilicon layer may be doped with P-type impurities.

Yet further methods of forming semiconductor devices according to embodiments of the invention include providing a semiconductor substrate including a cell area and a peripheral circuit area, the cell area including a main cell region and a peripheral cell region, and forming a first gate structure in the main cell region. The first gate structure includes a first tunnel oxide layer, a floating gate including a first conductive layer on the first tunnel oxide layer, a first dielectric layer including a first high-k dielectric material on the floating gate, and a control gate on the first dielectric layer, the control gate including a second conductive layer including polysilicon doped with P-type impurities and a third conductive layer including metal. A second gate structure is formed outside the main cell region. The second gate structure includes a second tunnel oxide layer, a fourth conductive layer on the second tunnel oxide layer, and a fifth conductive layer on the fourth conductive layer.

The first conductive layer and/or the fourth conductive layer may include polysilicon doped with N-type impurities. The first high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, MgO, SrO, $B_2O_3$, $SnO_2$, PbO, $PbO_2$, $Pb_3O_4$, $V_2O_3$, $La_2O_3$, $Pr_2O_3$, $Sb_2O_3$, $Sb_2O_5$ and/or CaO.

Forming the second conductive layer may include forming a polysilicon layer on the first dielectric layer, and doping the polysilicon layer with P-type impurities.

Forming the first dielectric layer may include forming a silicon oxide film on the floating gate, forming a silicon nitride film on the silicon oxide film, and forming a high-k dielectric film on the silicon nitride film.

The third conductive layer may include a metal nitride film and a metal film. In particular, the metal nitride film may include tungsten nitride, titanium nitride, tantalum nitride and/or titanium aluminum nitride, and the metal film may include tungsten, titanium and/or tantalum.

Methods according to some embodiments of the invention may further include forming a third gate structure in the peripheral cell region. The third gate structure includes a third tunnel oxide layer, a sixth conductive layer on the third tunnel oxide layer, a second dielectric layer including a second high-k dielectric material on the sixth conductive layer, a seventh conductive layer on the second dielectric layer, and an eighth conductive layer on the seventh conductive layer. The second dielectric layer and the seventh conductive layer may have widths substantially narrower than a width of the sixth conductive layer.

The second high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, MgO, SrO, $B_2O_3$, $SnO_2$, PbO, $PbO_2$, $Pb_3O_4$, $V_2O_3$, $La_2O_3$, $Pr_2O_3$, $Sb_2O_3$, $Sb_2O_5$ and/or CaO, and the second dielectric layer may include a silicon oxide film on the sixth conductive layer, a silicon nitride film on the silicon oxide film, and a high-k dielectric material on the silicon nitride film.

Methods of forming semiconductor devices according to still further embodiments of the invention include providing a semiconductor substrate having a cell area and a peripheral circuit area, the cell area including a main cell region and a peripheral cell region. A preliminary tunnel oxide layer is formed on the semiconductor substrate, and a preliminary first conductive layer is formed on the preliminary tunnel oxide layer. A preliminary dielectric layer is formed on the preliminary first conductive layer using a high-k dielectric material, and a preliminary second conductive layer is formed on the preliminary dielectric layer using polysilicon doped with P-type impurities. A preliminary second conductive layer pattern and a preliminary dielectric layer pattern are formed in at least the main cell region and the peripheral cell region by selectively etching the preliminary second conductive layer and the preliminary dielectric layer.

A preliminary third conductive layer including a metal is formed on the preliminary second conductive layer pattern and the preliminary first conductive layer, and a first gate structure is formed in the main cell region. The first gate structure includes a first tunnel oxide layer formed by patterning the preliminary tunnel oxide layer, a floating gate formed by patterning the preliminary first conductive layer, a first dielectric layer formed by patterning the preliminary dielectric layer, and a control gate including a second conductive layer formed by patterning the preliminary second conductive layer pattern and a third conductive layer formed by patterning the preliminary third conductive layer. A second gate structure is formed outside the main cell region to include a second tunnel oxide layer formed by patterning the preliminary tunnel oxide layer, a fourth conductive layer formed by patterning the preliminary first conductive layer, and a fifth conductive layer formed by patterning the preliminary third conductive layer.

The preliminary first conductive layer may include polysilicon doped with N-type impurities.

The high-k dielectric material may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, MgO, SrO, $B_2O_3$, $SnO_2$, PbO, $PbO_2$, $Pb_3O_4$, $V_2O_3$, $La_2O_3$, $Pr_2O_3$, $Sb_2O_3$, $Sb_2O_5$ and/or CaO.

Forming the preliminary dielectric layer may include forming a silicon oxide film on the preliminary first conductive layer, a silicon nitride film on the silicon oxide film, and forming a high-k dielectric layer on the silicon nitride film.

Forming the preliminary second conductive layer may include forming a polysilicon layer on the preliminary dielectric layer and doping the polysilicon layer with P-type impurities.

Forming the preliminary third conductive layer may include forming a metal nitride film on the preliminary second conductive layer, and forming a metal film on the metal nitride film. The metal nitride film may include tungsten nitride, titanium nitride, tantalum nitride and/or titanium aluminum nitride, and the metal film may include tungsten, titanium and/or tantalum.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
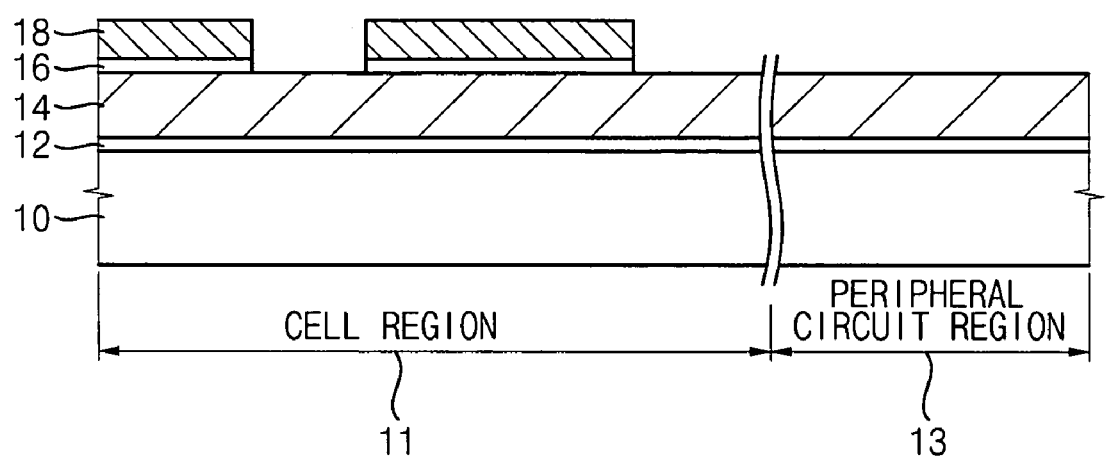
FIG. 1 is a cross-sectional view illustrating methods of forming conventional semiconductor devices.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
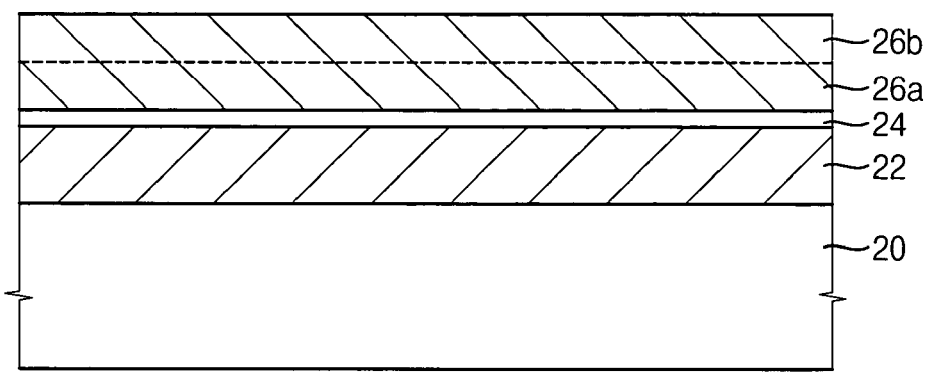
FIG. 2 is a cross-sectional view illustrating semiconductor devices in accordance with some embodiments of the invention.
Figure 3:
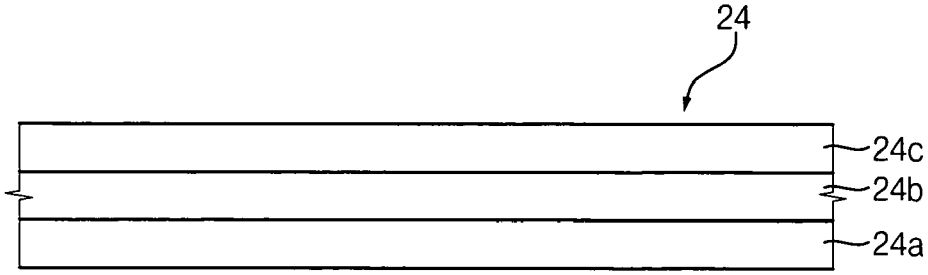
FIG. 3 is a cross-sectional view illustrating a dielectric layer according to some embodiments of the invention.
Figure 4:
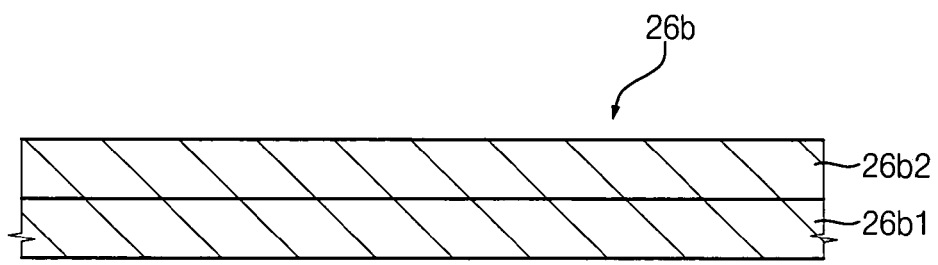
FIG. 4 is a cross-sectional view illustrating a third conductive layer according to some embodiments of the invention.

FIG. 2 is a cross-sectional view illustrating semiconductor devices in accordance with some embodiments of the invention. FIG. 3 is a cross-sectional view illustrating a dielectric layer in accordance with some embodiments of the invention. FIG. 4 is a cross-sectional view illustrating a conductive layer in accordance with some embodiments of the invention.

Referring to FIG. 2, a first conductive layer 22 is formed on a semiconductor substrate 20. The semiconductor substrate 20 may include, for example, a silicon wafer and/or a silicon-on-insulator (SOI) substrate. The first conductive layer 22 may be formed using a conductive material such as polysilicon doped with N-type impurities. Alternatively or additionally, the first conductive layer 22 may include a metal and/or a conductive metal nitride.

A dielectric layer 24 is formed on the first conductive layer 22. The dielectric layer 24 may have a thickness that is low enough to provide a relatively high capacitive coupling ratio. That is, the dielectric layer 24 may be formed using a high-k dielectric material so as to have a relatively small equivalent oxide thickness (EOT) and also to reduce leakage current through the dielectric layer 24. The dielectric layer 24 may be formed using a metal oxide. For example, the dielectric layer 24 may be formed using $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$, etc., either alone or in a mixture thereof.

In some embodiments of the invention, the dielectric layer 24 may have a multi layer structure that includes an oxide film 24a, a nitride film 24b and a metal oxide film 24c sequentially formed as shown in FIG. 3. The oxide film 24a may be formed using, for example, silicon oxide, and the nitride film 24b may be formed using, for example, silicon nitride. The metal oxide film 24c may be formed using a high-k material such as, for example, one or more of the high-k materials described above.

In some embodiments of the invention, the dielectric layer 24 may include at least one oxide film, at least one nitride film, and at least one film of high-k material formed on the first conductive layer 22.

A second conductive layer 26a may be formed on the dielectric layer 24. The second conductive layer 26a may be formed using a conductive material such as polysilicon doped with P-type impurities. Alternatively, the second conductive layer 26a may be formed using a conductive metal nitride and/or a metal.

A third conductive layer 26b may be formed on the second conductive layer 26a. In some embodiments of the invention, the third conductive layer 26b may include a metal film. The metal film may include, for example, tungsten, titanium, tantalum, aluminum, copper, etc., either alone or in a mixture thereof.

In other embodiments of the invention, the third conductive layer 26b may include a conductive metal nitride film. The conductive metal nitride film may include, for example, tungsten nitride, aluminum nitride, titanium nitride, tantalum nitride, aluminum nitride, titanium aluminum nitride, etc. These can be used alone or in a mixture thereof.

In further embodiments, the third conductive layer 26b may include both a metal and a conductive metal nitride. For example, the third conductive layer 26b may be formed using a metal such as tungsten (W), titanium (Ti), tantalum (Ta), aluminum (Al), and/or copper (Cu), etc., and a metal nitride such as tungsten nitride (WN), aluminum nitride (AlN), titanium nitride (TiN), tantalum nitride (TaN), and/or titanium aluminum nitride (TiAlN), etc..

In still further embodiments of the invention, the third conductive layer 26b may have a multi-layer structure that includes a metal nitride film 26b1 and a metal film 26b2 sequentially formed on the second conductive layer 26a.

The second conductive layer 26a may serve as a hard mask for patterning the dielectric layer 24. Additionally, the second conductive layer 26a may effectively reduce defects which may otherwise be generated in the third conductive layer 26b when the third conductive layer 26b includes only a metal film 26b2. Since the second conductive layer 26a may include polysilicon doped with the P-type impurities, the second conductive layer 26a may have a work function relatively higher than that of a first conductive layer 22 including polysilicon doped with N-type impurities. The second conductive layer 26a may be advantageously formed using polysilicon heavily doped with P-type impurities.

In some embodiments of the invention, the semiconductor device may include a first conductive layer 22, a dielectric layer 24 including a high-k dielectric material, a second conductive layer 26a including polysilicon doped with the P-type impurities, and a third conductive layer 26b including a metal. Thus, a semiconductor device such as a storage transistor may have an improved capacitive coupling ratio and/or a reduced leakage current.

Figure 5A:
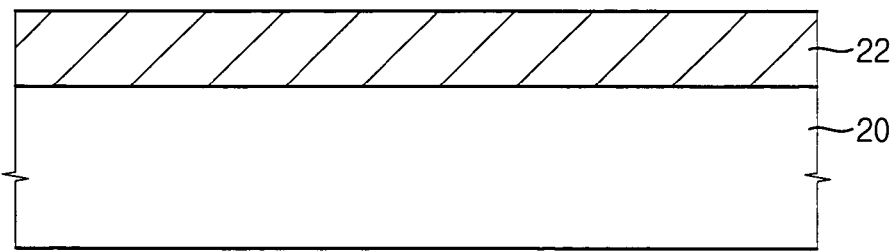
FIGS. 5A to 5C are cross-sectional views illustrating methods of forming semiconductor devices in accordance with some embodiments of the invention.
Figure 5B:
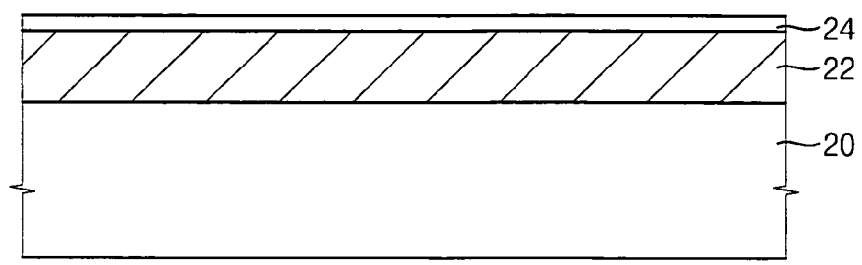
Figure 5C:
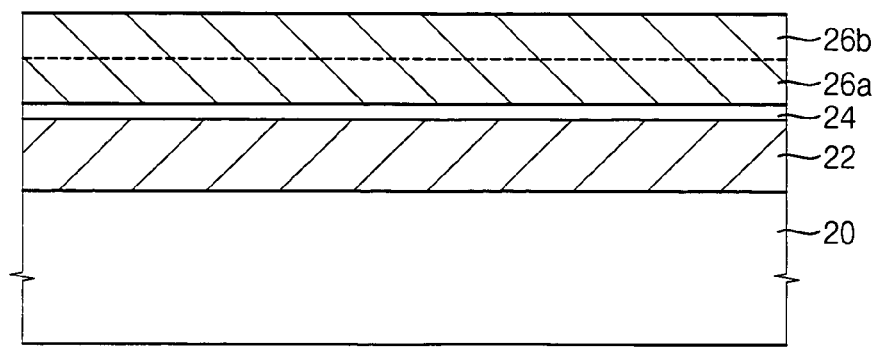

FIGS. 5A to 5C are cross-sectional views illustrating some methods of forming semiconductor devices in accordance with an embodiment of the invention.

Referring to the embodiments of FIG. 5A, a first conductive layer 22 is formed on a semiconductor substrate 20 such as, for example, a silicon wafer. The first conductive layer 22 may be formed, for example, using polysilicon doped with N-type impurities. The first conductive layer 22 may be formed through two steps. In a first step, a polysilicon layer is formed on the semiconductor substrate 20. N-type impurities may be doped into the polysilicon layer in a second step to complete the first conductive layer 22. The first step may be performed in a furnace. For example, the first step may be carried out using silane ($SiH_4$) gas in a thermal decomposition process. The silane gas may include a pure silane gas, and/or a silane gas diluted with about 20 to about 30 percent by weight of nitrogen, etc. If the first step is executed at a temperature of less than about 500° C., the deposition rate of the polysilicon layer may be too low. If the first step is performed at a temperature of greater than about 650° C., the silane gas may be exhausted early, so that uniformity of the polysilicon layer may be degraded. Therefore, the first step of forming the polysilicon layer may be carried out in some embodiments at a temperature of from about 500° C. to about 650° C. Additionally, the polysilicon layer may be formed at a pressure of from about 25 Pa to about 150 Pa.

The second step for doping the N-type impurities into the polysilicon layer may be performed by a diffusion process, an ion implantation process and/or an in-situ doping process.

Referring to the embodiments of FIG. 5B, a dielectric layer 24 may be formed on the first conductive layer 22. The dielectric layer 24 may be formed using, for example, a high-k dielectric material such as a metal oxide. For example, the dielectric layer 24 may be formed using $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, either alone and/or in a mixture thereof.

In some embodiments of the invention, the dielectric layer 24 may include film of a high-k material including $Al_2O_3$ formed on the first conductive layer 22. Additionally, the dielectric layer 24 may include a silicon oxide film and/or a silicon nitride film sequentially formed between the first conductive layer 22 and the high-k material film. In particular, the silicon oxide film and/or the silicon nitride film may be formed successively on the first conductive layer 22, for example, by chemical vapor deposition (CVD) processes. The high-k material film may be formed on the silicon nitride film by a sputtering process, a CVD process, and/or an atomic layer deposition (ALD) process, etc.

In an ALD process for forming the high-k material film, a substrate 20 including a silicon oxide film and a silicon nitride film thereon may be loaded into a chamber. The temperature and the pressure in the chamber are properly adjusted.

If the temperature in the chamber is too low, the reactivity of reactants for forming the high-k material film may be low. However, if the temperature of the chamber is too high, the crystallization rate of ingredients in the high-k material film may be somewhat fast, such that the high-k material film may have characteristics of a material formed by CVD process instead of an ALD process. Thus, in some embodiments, the chamber may have a temperature of about 150° C. to about 400° C. The chamber may preferably have a temperature of about 300° C., because a high-k material formed at such a temperature may have excellent characteristics.

An aluminum source material may be provided onto the substrate 20 as a first reactant. The aluminum source material may include, for example, trimethyl aluminum ($Al(CH_3)_3$; TMA). The first reactant may be introduced into the chamber for about two seconds. A first portion of the aluminum source material may be chemically adsorbed (i.e., chemisorbed) into the silicon nitride film on the substrate 20, whereas a second portion of the aluminum source material may be physically adsorbed (i.e., physisorbed) into the silicon nitride film on the substrate 20.

After the first portion of the aluminum source material is chemisorbed to the silicon nitride film, a purge gas such as, for example, an argon (Ar) gas may be introduced into the chamber as a first purge gas to remove the physisorbed second portion of the aluminum source material from the chamber. The first purge gas may be introduced into the chamber for about three seconds.

An oxidant may be provided onto the substrate 20 loaded in the chamber for about three seconds. The oxidant may include $O_3$, $H_2O$, $H_2O_2$, $CH_3OH$, $C_2H_5OH$, etc., either alone or in a mixture thereof. The oxidant may preferably include $O_3$. When the oxidant is introduced into the chamber, the chemisorbed first portion of the aluminum source material may be oxidized by the oxidant agent, thereby forming a high-k material film including aluminum oxide on the silicon nitride film.

A second purge gas such as argon (Ar) may be introduced into the chamber as a second purge gas to remove unreacted oxidant from the chamber. The second purge gas may be introduced for about three seconds.

A high-k material film having a desired thickness may be formed on the silicon nitride film by repeatedly providing the aluminum source material, introducing the first purge gas, providing the oxidant and introducing the second purge gas. When the high-k material film is formed on the silicon nitride film, the dielectric layer 24 including a silicon oxide film 24a, a silicon nitride film 24b and a high-k material film 24c is completed on the first conductive layer 22. A high-k material film including aluminum oxide according to some embodiments of the invention may have a small equivalent oxide thickness (EOT) and/or may effectively reduce leakage current therethrough. Therefore, the dielectric layer 24 including a high-k material film may have a small thickness and/or improved electrical characteristics.

Referring to the embodiments of FIG. 5C, a second conductive layer 26a may be formed on the dielectric layer 24. The second conductive layer 26a may include polysilicon doped with P-type impurities. The second conductive layer 26a may be formed by a process similar to that of forming the first conductive layer 22, excluding doping. The second conductive layer 26a may be formed by forming a polysilicon layer on the dielectric layer 24 and doping P-type impurities into the polysilicon layer.

A third conductive layer 26b may be formed on the second conductive layer 26a. The third conductive layer 26b may include a conductive metal nitride and/or a metal. The third conductive layer 26b may have a multi-layer structure that includes a metal nitride film and a metal film sequentially formed on the second conductive layer 26a. For example, the third conductive layer 26b may include a tungsten nitride film and a tungsten film.

In the formation of the third conductive layer 26b, a tungsten nitride film may be formed on the second conductive layer 26a by a first sputtering process. The first sputtering process may be carried out at a temperature of from about 120° C. to about 200° C. under a pressure of from about 10 mTorr to about 20 mTorr by applying at a power of about 200 W to about 800 W. A flow rate of a nitrogen ($N_2$) gas may be in a range of about 30 sccm to 50 sccm in the first sputtering process. Alternatively, the tungsten nitride film may be formed on the second conductive layer 26a by a CVD process and/or an ALD process.

A tungsten film may be formed on the tungsten nitride film by a second sputtering process. The second sputtering process may be performed at a temperature of from about 120° C. to 20020 C. under a pressure from about 10 mTorr to about 20 mTorr by applying a power of about 1.8 to 2.2 kW. Alternatively, the tungsten film may be formed on the tungsten nitride film by a CVD process and/or an ALD process. The first and second sputtering processes may be executed as in-situ processes using one chamber under a similar vacuum pressure.

The third conductive layer 26b including a metal nitride film and a metal film may be formed on the second conductive layer 26a by the above-described processes.

According to some embodiments of the invention, a semiconductor device such as a storage transistor includes a dielectric layer 24 having a high-k material film, a second conductive layer 26a including polysilicon doped with P-type impurities and a third conductive layer 26b including metal. Such a device may have an enhanced capacitive coupling ratio and/or reduced leakage current.

Figure 6:
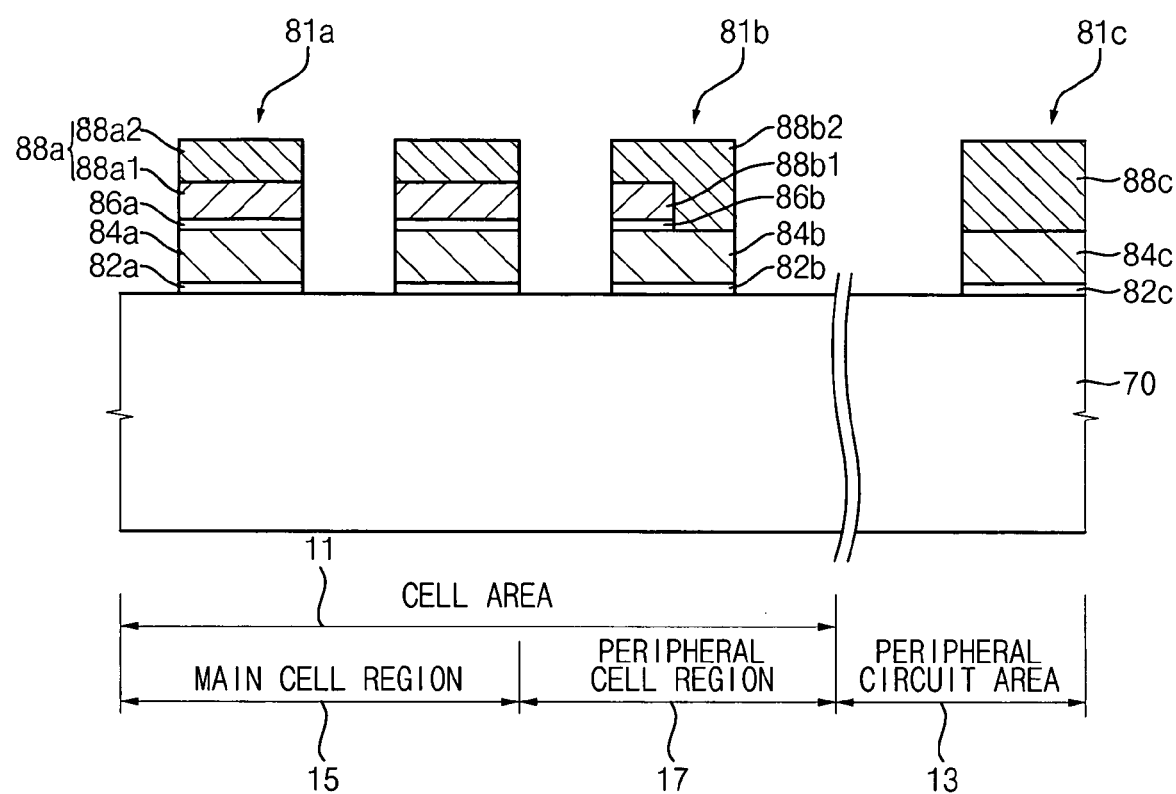
FIG. 6 is a cross-sectional view illustrating semiconductor devices in accordance with some embodiments of the invention.

FIG. 6 is a cross-sectional view illustrating a semiconductor structure in accordance with some embodiments of the invention.

Referring to the embodiments of FIG. 6, a first gate structure 81a may be formed in a cell area 11 of a semiconductor substrate 70. The first gate structure 81a may serve as a storage transistor of a flash memory device. In particular, the first gate structure 81a may be positioned in a main cell region 15 of the semiconductor substrate 70. The first gate structure 81a may include a first tunnel oxide layer pattern 82a, a first floating gate 84a, a first dielectric layer pattern 86a and a first control gate 88a sequentially formed on the substrate 70. The first tunnel oxide layer pattern 82a, the first floating gate 84a, the first dielectric layer pattern 86a and the first control gate 88a may have widths similar to one another.

The first tunnel oxide layer pattern 82a of the first gate structure 81a may include silicon oxide. The first floating gate 84a of the first gate structure 81a may be similar to the first conductive layer 22 described with reference to FIG. 2. Thus, the first floating gate 84a of the first gate structure 81a may include polysilicon doped with N-type impurities. The first dielectric layer pattern 86a of the first gate structure 81a may include a first thin film pattern of a high-k dielectric material. The first thin film pattern may include a high-k dielectric material similar to those described with reference to FIG. 3. The dielectric layer pattern 86a may further include a silicon oxide film pattern and a silicon nitride film pattern. That is, the first dielectric layer pattern 86a may include a silicon oxide film pattern, a silicon nitride film pattern and a first thin film pattern of a high-k dielectric material sequentially formed on the first floating gate 84a.

The first control gate 88a of the first gate structure 81a may include a second conductive layer pattern 88a1 and a third conductive layer pattern 88a2. The second conductive layer pattern 88a1 may be similar to the second conductive layer pattern 26a described with reference to FIG. 2, and the third conductive layer pattern 88a2 may be corresponded to the third conductive layer 26b described with reference to FIG. 2. Thus, the first control gate 88a of the first gate structure 81a may have a second conductive layer pattern 88a1 including polysilicon doped with P-type impurities, and a third conductive layer pattern 88a2 including a metal nitride film pattern and a metal film pattern.

In some embodiments of the invention, the first gate structure 81a of a storage transistor positioned in the main cell region 15 may have an enhanced capacitive coupling ratio and/or reduced leakage current because the first dielectric layer pattern 84a may include a first thin film pattern of a high-k dielectric material, and the first control gate 88a may include a second conductive layer pattern 88a1 doped with the P-type impurities and having a high work function and a third conductive layer pattern 88a2.

A second gate structure 81c may be formed at least partially within a peripheral circuit area 13 of the semiconductor substrate 70. The second gate structure 81c may serve as a switching transistor, an amplifier and/or a sensor of the flash memory device. The second gate structure 81c may include a second tunnel oxide layer pattern 82c, a fourth conductive layer pattern 84c and a fifth conductive layer pattern 88c. The second tunnel oxide layer pattern 82c, the fourth conductive layer pattern 84c and the fifth conductive layer pattern 88c may have widths substantially similar to one another.

The second tunnel oxide layer pattern 82c of the second gate structure 81c may be similar to the first tunnel oxide layer pattern 82a of the first gate structure 81a. The fourth conductive layer pattern 84c of the second gate structure 81c may be similar to the first floating gate 84a of the first gate structure 81a. Thus, the fourth conductive layer pattern 84c of the second gate structure 81c may include polysilicon doped with N-type impurities. The fifth conductive layer pattern 88c of the second gate structure 81c may correspond to the third conductive layer pattern 88a2 of the first control gate 88a of the first gate structure 81a. As a result, the second gate structure 81c may include a second tunnel oxide layer pattern 82c of silicon oxide, a fourth conductive layer pattern 84c of polysilicon doped with N type impurities, and a fifth conductive layer pattern 88c including a metal nitride film pattern and/or a metal film pattern.

The second gate structure 81c in the peripheral circuit area may have a simplified structure in comparison with that of the first gate structure 81a in the main cell region 15. Thus, a flash memory device in accordance with some embodiments of the invention may include various gate structures having different functions as occasion demands.

The second gate structure 81c may be formed at least partially in the peripheral cell region 17 of the substrate 70 outside the main cell region. The peripheral cell region 17 may enclose the main cell region. The peripheral cell region may be adjacent to the peripheral circuit area 13 and/or another cell area. Since a source select line (SSL) and/or a ground select line (GSL) may be formed at least partially in the peripheral cell region 17, an additional gate structure (not shown) may be formed in the peripheral cell region 17. This additional gate structure may have a structure similar to that of the second gate structure 81c.

In some embodiments of the invention, a third gate structure 81b may be formed at least partially in the peripheral cell region 17 in order to provide a desired process margin while forming the first gate structure 81a in the main cell region 15.

The third gate structure 81b may have a construction similar to that of the first gate structure 81a except that the third gate structure 81b may include a second dielectric layer pattern 86b and a seventh conductive layer pattern 88b1. That is, the third gate structure 81b may include a third tunnel oxide layer pattern 82b similar to the first tunnel oxide layer pattern 82a of the first gate structure 81a, and a sixth conductive layer pattern 84b similar to the floating gate 84a of the first gate structure 81a. In addition, the third gate structure 81b may include a second dielectric layer pattern 86b having a width substantially smaller than that of the sixth conductive layer pattern 84b. The second dielectric layer pattern 86b of the third gate structure 81b may include a material similar to that of the first dielectric layer pattern 86a of the first gate structure 81a. The third gate structure 81b may also include a seventh conductive layer pattern 88b1 having a width similar to that of the second dielectric layer pattern 86b. The seventh conductive layer pattern 88b1 of the third gate structure 81b may include a material similar to that of the second conductive layer pattern 88a1 of the first gate structure 81a. The third gate structure 81b may further include an eighth conductive layer pattern 88b2 having a width similar to that of the third conductive layer pattern 88a2 of the first gate structure 81a. Additionally, the eighth conductive layer 88b2 may include a material substantially similar to that of the third conductive layer pattern 88a2. As a result, the third gate structure 81b in the peripheral cell region 17 may include the third tunnel oxide layer pattern 82b, the sixth conductive layer pattern 84b, the second dielectric layer pattern 86b having a relatively narrow width, the seventh conductive layer pattern 88b1 also having a relatively narrow width, and the eighth conductive layer pattern 88b2.

In some embodiments of the invention, since the third gate structure 81b may be formed in the peripheral cell region 17, a desired process margin of the process for forming the flash memory device may be obtained. Thus, the process may be advantageously employed for forming other semiconductor devices having very small feature sizes.

FIGS. 7A to 7D are cross-sectional views illustrating methods of forming semiconductor devices in accordance with some embodiments of the invention.

Figure 7A:
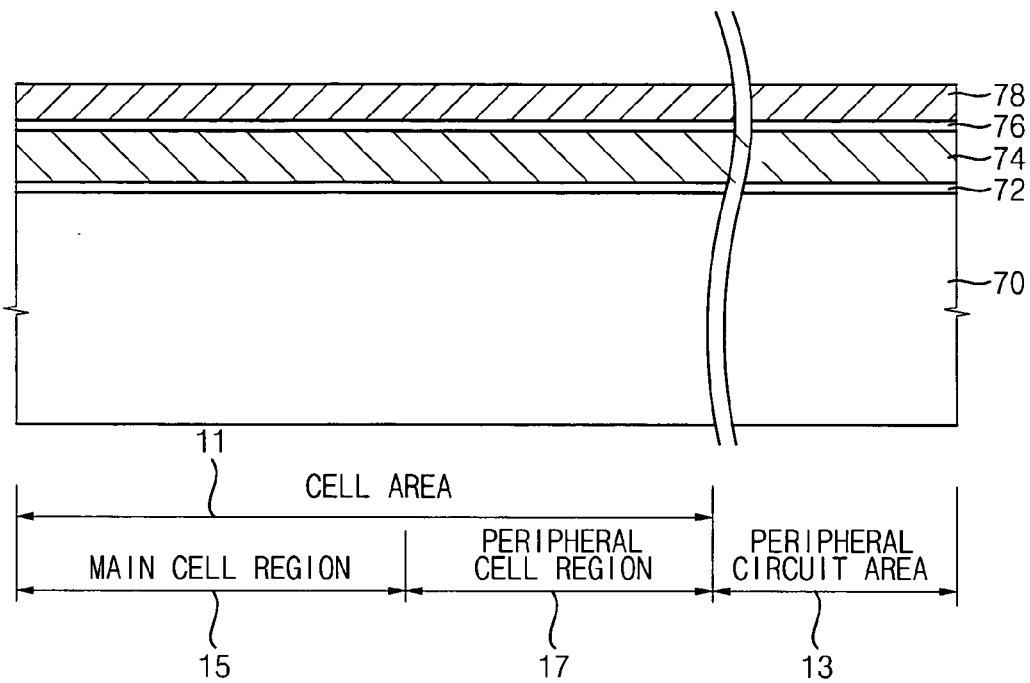
FIGS. 7A to 7D are cross-sectional views illustrating methods of forming semiconductor devices in accordance with further embodiments of the invention.

Referring to the embodiments of FIG. 7A, there is provided a semiconductor substrate 70 having a cell area 11 and a peripheral circuit area 13. The cell area 11 may be divided into a main cell region 15 and a peripheral cell region 17.

A preliminary tunnel oxide layer 72 is formed in the cell area 11 and the peripheral circuit area 13 of the semiconductor substrate 70. The preliminary tunnel oxide layer 72 may be formed using silicon oxide, for example, by a thermal oxidation process and/or a radical oxidation process. The preliminary tunnel oxide layer 72 may have a thickness of from about 10 Å to about 300 Å. The preliminary tunnel oxide layer 72 may preferably have a thickness of from about 50 Å to about 70 Å.

A preliminary first conductive layer 74 is formed on the preliminary tunnel oxide layer 72. The preliminary first conductive layer 74 may be formed by a process similar to that of the first conductive layer 22 described with reference to FIG. 2. Thus, the preliminary first conductive layer 74 may be formed using polysilicon doped with N-type impurities. The preliminary first conductive layer 74 may have a thickness of from about 300 Å to about 1,000 Å. The preliminary first conductive layer 74 may preferably have a thickness of from about 300 Å to about 700 Å. As formed, the preliminary first conductive layer 74 may be substantially free of defects such as voids or seams therein.

A preliminary dielectric layer 76 may be formed on the preliminary first conductive layer 74. The preliminary dielectric layer 76 may include a thin film of a high-k dielectric material. The high-k dielectric material may be similar to that described with reference to FIG. 3. The preliminary dielectric layer 76 may additionally include a silicon oxide film and/or a silicon nitride film. That is, the preliminary dielectric layer 76 may, for example, include a silicon oxide film formed on the preliminary first conductive layer 74, a silicon nitride film formed on the silicon oxide film, and a thin film of the high-k dielectric material formed on the silicon nitride film. The silicon oxide film, the silicon nitride film and the thin film of the high-k dielectric material may be formed through processes similar to those described with reference to FIG. 3. The preliminary dielectric layer 76 may have a thickness of from about 150 Å to about 300 Å. The preliminary dielectric layer 76 may preferably have a thickness of from about 180 Å to about 300 Å.

A preliminary second conductive layer 78 may be formed on the preliminary dielectric layer pattern 76. The preliminary second conductive layer 78 may be formed using polysilicon doped with P-type impurities. The preliminary second conductive layer 78 may be formed by a process similar to that of the second conductive layer 26a described with reference to FIG. 2. The preliminary second conductive layer 78 may have a thickness of about 300 to about 1,000 Å. The preliminary second conductive layer 78 may preferably have a thickness of from about 300 Å to about 700 Å.

Figure 7B:
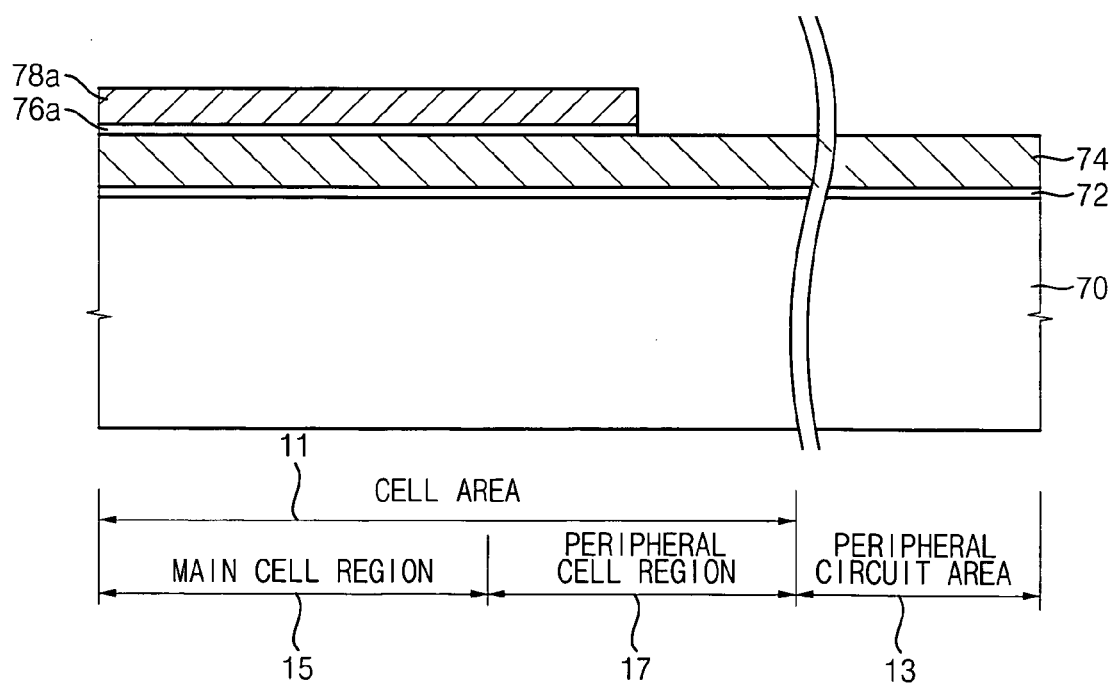

Referring FIG. 7B, after a photoresist pattern (not shown) is formed on the preliminary second conductive layer 78, the preliminary second conductive layer 78 and the preliminary dielectric layer 76 may be selectively etched using the photoresist pattern as an etching mask. Thus, a preliminary second conductive layer pattern 78a and a preliminary dielectric layer pattern 76a may be patterned on the preliminary first conductive layer 74. The preliminary second conductive layer pattern 78a and the preliminary dielectric layer pattern 76a may be positioned at least partially in the main cell region 15. The preliminary second conductive layer pattern 78a and the preliminary dielectric layer pattern 76a may be positioned at least partially in the peripheral cell region 17. However, the preliminary second conductive layer pattern 78a and the preliminary dielectric layer pattern 76a may not be formed in the peripheral circuit area 13.

If the preliminary second conductive layer pattern 78a and the preliminary dielectric layer pattern 76a are not formed in the peripheral cell region 17, it may be difficult to obtain desired process margins for subsequent processes. Thus, the preliminary second conductive layer pattern 78a and the preliminary dielectric layer pattern 76a may be positioned in the peripheral cell region 17 so as to provide desired process margins for the subsequent processes.

In some embodiments of the invention, the preliminary second conductive layer pattern 78a may be oxidized in an ashing process for removing the photoresist pattern.

Figure 7C:
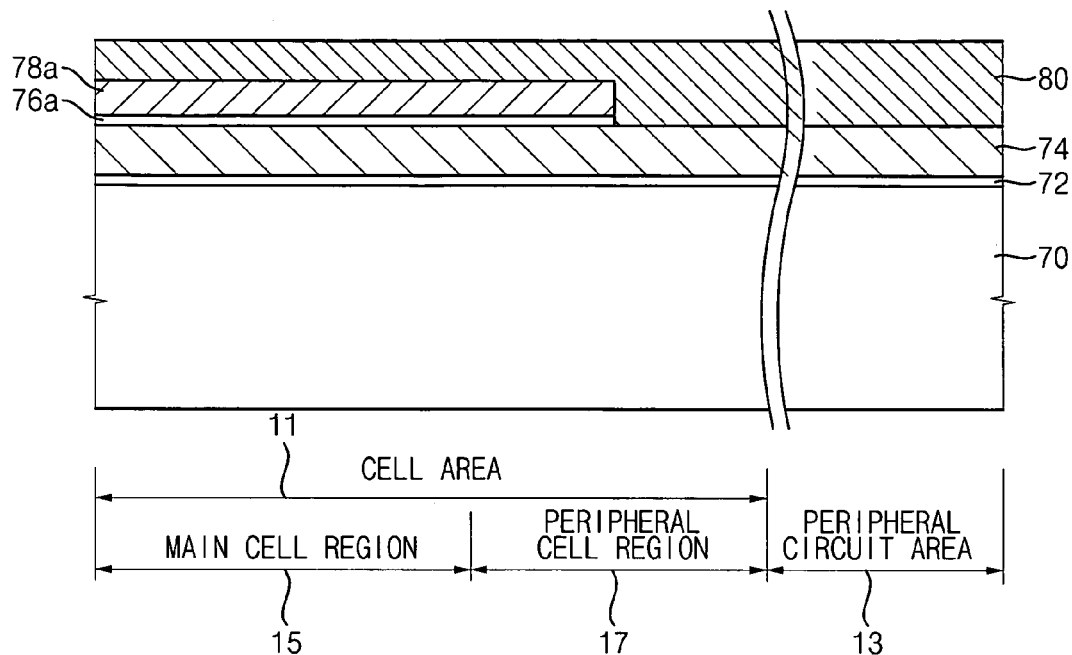

Referring to the embodiments of FIG. 7C, a preliminary third conductive layer 80 may be formed on the preliminary second conductive layer pattern 78a and the preliminary first conductive layer 74. The preliminary third conductive layer 80 may be formed by processes similar to those described with reference to FIG. 3. Thus, the preliminary third conductive layer 80 may include a metal nitride film and/or a metal film. The preliminary third conductive layer 80 may have a thickness of from about 300 Å to about 500 Å. The preliminary third conductive layer 80 may preferably have a thickness of from about 300 Å to about 400 Å. For example, the preliminary third conductive layer 80 may include a metal nitride film having a thickness of about 50 Å, and a metal film having a thickness of about 300 Å. According to some embodiments of the invention, the process for forming the preliminary third conductive layer 80 may be performed only once so that processes for manufacturing the semiconductor device may be simplified.

After forming the preliminary third conductive layer 80, an upper portion of the preliminary third conductive layer 80 may be planarized. A chemical mechanical polishing (CMP) process and/or an etch back process may be employed for planarizing the preliminary third conductive layer 80. After planarizing the preliminary third conductive layer 80, the preliminary third conductive layer 80 may have a level surface. That is, stepped portions of the preliminary third conductive layer 80 caused by the preliminary second conductive layer pattern 78a and the preliminary dielectric layer pattern 76a may be removed in the planarization process.

In some embodiments of the invention, after planarizing the preliminary third conductive layer 80, a hard mask layer (not shown) may be formed on the preliminary third conductive layer 80. The hard mask layer may be formed, for example, using a nitride such as silicon nitride. The hard mask layer may have a thickness of from about 1,000 Å to about 1,200 Å.

Figure 7D:
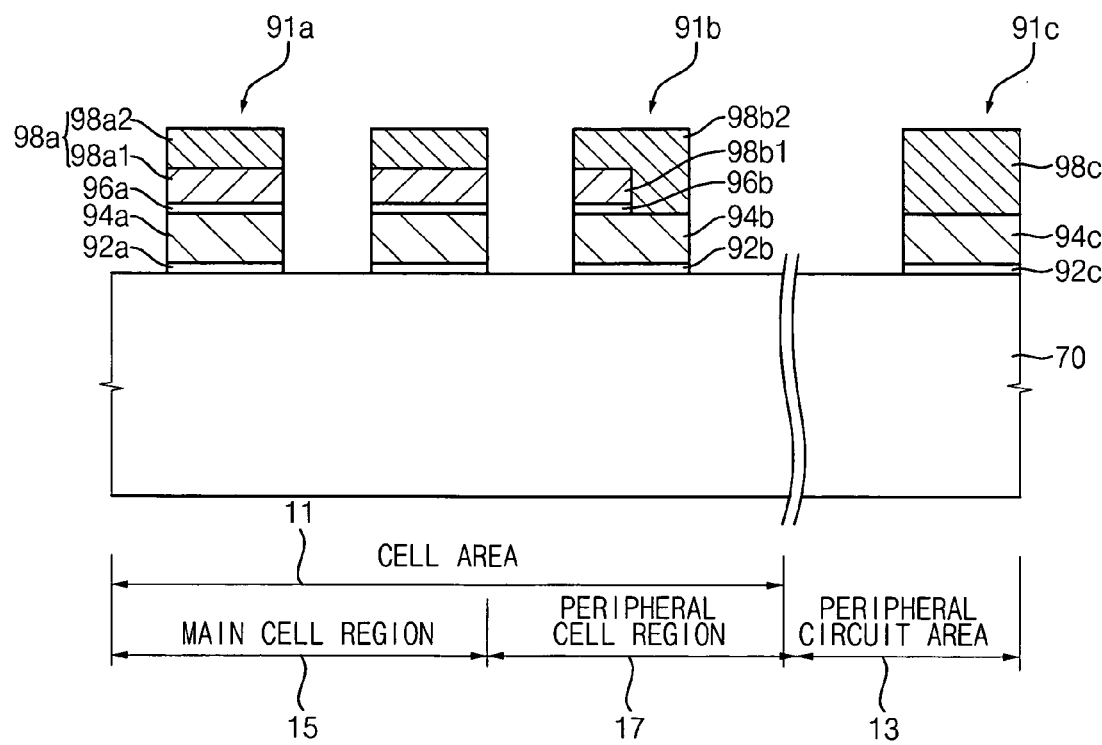

Referring to the embodiments of FIG. 7D, the resulting structure including the preliminary third conductive layer 80 may be selectively etched until the semiconductor substrate 70 is exposed. The resultant structure may be etched by a photolithography process using, for example, a photoresist pattern as an etching mask. After the resultant structure is etched, a first gate structure 91a, a second gate structure 91c and a third gate structure 91b may be formed on the substrate 70. The first gate structure 91a may be positioned at least partially in the main cell region 15, and the second gate structure 91c may be formed at least partially in the peripheral circuit area 13. Additionally, the third gate structure 91b may be located at least partially in the peripheral cell region. An additional gate structure (not shown) may be formed in the peripheral cell region 17.

The first gate structure 91a may include a first tunnel oxide layer pattern 92a, a first floating gate 94a, a first dielectric layer pattern 96a, and a first control gate 98a. The first control gate 98a may include a second conductive layer pattern 98a1 and/or a third conductive layer pattern 98a2. The first tunnel oxide layer pattern 92a may be formed by patterning the preliminary tunnel oxide layer 72, and the first floating gate 94a may be formed by patterning the preliminary first conductive layer 74. The first dielectric layer pattern 96a may be formed by patterning the preliminary dielectric layer pattern 76a. The second conductive layer pattern 98a1 of the first control gate 98a may be formed by patterning the preliminary second conductive layer pattern 78a, and the third conductive layer pattern 98a2 of the first control gate 98a may be formed by patterning the preliminary third conductive layer 80. The first gate structure 91a may serve, for example, as a storage transistor.

The second gate structure 91c may include the second tunnel oxide layer pattern 92c, a fourth conductive layer pattern 94c and a fifth conductive layer pattern 98c. The second tunnel oxide layer pattern 92c may be formed by patterning the preliminary tunnel oxide layer 72, and the fourth conductive layer pattern 94c may be formed by patterning the preliminary first conductive layer 74. Additionally, the fifth conductive layer pattern 98c may be formed by patterning the preliminary third conductive layer 80. The second gate structure 91c may serve, for example, as a switching transistor, an amplifier or a sensor of a flash memory device.

If the preliminary dielectric layer pattern 76a and the preliminary second conductive layer pattern 78a are formed only in the main cell region, then in order to ensure adequate process margins, an additional gate structure, which may have a construction similar to that of the second gate structure 91c, may be formed in the peripheral cell region 17.

According to some embodiments of the invention, when the preliminary dielectric layer pattern 76a and the preliminary second conductive layer pattern 78a are formed in the main and peripheral cell regions 15 and 17, a third gate structure 91b may be formed at least partially in the peripheral cell region 17. The third gate structure 91b may include a third tunnel oxide layer pattern 92b, a sixth conductive layer pattern 94b, a second dielectric layer pattern 96b, a seventh conductive layer pattern 98b1, and an eighth conductive layer pattern 98b2. The third tunnel oxide layer pattern 92b may be formed by patterning the preliminary tunnel oxide layer 72, and the sixth conductive layer pattern 94b may be formed by patterning the preliminary first conductive layer 74. The second dielectric layer pattern 96b may have a relatively narrower width than that of the sixth conductive layer pattern 94b, and the seventh conductive layer pattern 98b1 may have a width similar to that of the second dielectric layer pattern 96b. The second dielectric layer pattern 96b may be formed by patterning the preliminary dielectric layer pattern 76a. The seventh conductive layer pattern 98b1 may be formed by patterning the preliminary second conductive layer pattern 78a. The eighth conductive layer pattern 98b2 may be formed by patterning the preliminary third conductive layer 80. The third gate structure 91b or the additional gate structure (not shown) may serve, for example, as a source select line (SSL) or a ground select line (GSL).

According to some embodiments of the invention, several gate structures including first, second and third gate structures may be simultaneously formed on a substrate. Conductive layer patterns of the gate structures including metal may not be exposed in an ashing process for removing a photoresist pattern. Thus, the conductive layer patterns including metal may not be oxidized, and the process for forming the gate structures may be simplified. In addition, since dielectric layer patterns of the gate structures may include high-k dielectric materials having a high work function, a flash memory device incorporating the dielectric layer pattern may have an enhanced capacitive coupling ratio and/or improved electrical characteristics.

Further, since a second conductive layer pattern of a control gate may include polysilicon doped with P-type impurities, an additional process for forming a resistor may not be required for the flash memory device. In particular, since a conventional control gate may include a metal conductive layer pattern, an additional process for forming another conductive layer pattern may typically be carried out to form the resistor. However, according to some embodiments of the invention, the control gate may include a second conductive layer pattern having polysilicon doped with the P-type impurities, so that the second conductive layer pattern may advantageously be used as the resistor.

According to some embodiments of the present invention, a semiconductor device such as a flash memory device may have an enhanced capacitive coupling ratio and/or reduced leakage current. Additionally, the semiconductor device may be easily manufactured through simplified manufacturing processes. Therefore, the reliability of the semiconductor device may be improved, whereas the time and/or cost required for manufacturing the semiconductor device may be reduced.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device comprising:
   a tunnel oxide layer formed in a cell area of a semiconductor substrate, the cell area including at least a main cell region and a peripheral cell region;
   a floating gate on the tunnel oxide layer, the floating gate having a first conductive layer including polysilicon doped with N-type impurities;
   a dielectric layer on the floating gate, the dielectric layer including a high-k material; and
   a control gate on the dielectric layer, the control gate including a second conductive layer including polysilicon doped with P-type impurities, and a third conductive layer including a metal;
   wherein the tunnel oxide layer, the floating gate and the third conductive layer form a device structure in the peripheral cell region outside the main cell region, and wherein the dielectric layer and the second conductive layer of the device structure have widths substantially smaller than a width of the floating gate of the device structure.

2. The semiconductor device of claim 1, wherein the high-k material comprises $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$ and/or $CaO$.

3. The semiconductor device of claim 1, wherein the dielectric layer further comprises an ONO structure including a silicon oxide film and a silicon nitride film.

4. The semiconductor device of claim 1, wherein the third conductive layer comprises a metal nitride film and/or a metal film.

5. The semiconductor device of claim 4, wherein the third conductive layer comprises a metal nitride film and a metal film, and wherein the metal film comprises tungsten, titanium and/or tantalum, and the metal nitride film comprises tungsten nitride, titanium nitride, tantalum nitride and/or titanium aluminum nitride.

6. The semiconductor device of claim 1, wherein the second dielectric layer further comprises a silicon oxide film and a silicon nitride film.

7. The semiconductor device of claim 1, wherein the second conductive layer has a work function greater than a work function of the first conductive layer.

* * * * *